(12) United States Patent
Di Gregorio

(10) Patent No.: US 7,280,401 B2
(45) Date of Patent: Oct. 9, 2007

(54) HIGH SPEED DATA ACCESS MEMORY ARRAYS

(75) Inventor: Luigi Di Gregorio, San Jose, CA (US)

(73) Assignee: Telairity Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/618,564

(22) Filed: Jul. 10, 2003

(65) Prior Publication Data

US 2006/0291300 A1    Dec. 28, 2006

(51) Int. Cl.
*G11C 16/04*    (2006.01)
(52) U.S. Cl. ............... 365/185.17; 365/63; 365/230.03
(58) Field of Classification Search ........... 365/185.17, 365/63, 230.03
See application file for complete search history.

(56) References Cited

U.S. PATENT DOCUMENTS

| | | | |
|---|---|---|---|
| 4,823,313 A | 4/1989 | Kadota | |
| 5,170,375 A | 12/1992 | Mattausch et al. | |
| 6,292,401 B1* | 9/2001 | Zhang et al. | 365/189.02 |
| 6,477,074 B2 | 11/2002 | Kikutake et al. | |
| 6,538,956 B2 | 3/2003 | Ryu et al. | |
| 6,597,611 B2* | 7/2003 | Desai et al. | 365/203 |
| 6,603,692 B2 | 8/2003 | Hirota | |
| 6,614,710 B2* | 9/2003 | Song et al. | 365/230.03 |
| 6,654,301 B2* | 11/2003 | Chehrazi et al. | 365/204 |
| 2003/0090944 A1 | 5/2003 | Shimizu et al. | |
| 2004/0139271 A1* | 7/2004 | Khellah et al. | 711/1 |

* cited by examiner

*Primary Examiner*—Connie C. Yoha
(74) *Attorney, Agent, or Firm*—Townsend and Townsend and Crew LLP

(57) ABSTRACT

Techniques for reading data from memory cells in memory arrays are provided. Local read bit lines are coupled to logic gates such as NAND gates. The input terminals of each logic gate are coupled to receive signals from two of the local read bit lines. The output of the logic gate changes state when a signal on one of the local read bit lines changes state. The signal from the logic gates are transmitted to global bit lines. Memory arrays can have multiple global bit lines to reduce delays caused by resistance and capacitance on the wire. Repeater circuits can propagate a signal from one global bit line to another global bit line.

14 Claims, 6 Drawing Sheets

HIGH SPEED DATA ACCESS MEMORY ARRAYS

BACKGROUND OF THE INVENTION

The present invention relates to memory arrays, and more particularly to high speed techniques for reading data from memory arrays.

Prior art memory arrays includes rows and columns of static random access memory cells (SRAM). Each SRAM cell includes two cross coupled inverter circuits that store one bit of data. In a multi-port SRAM, each row of memory cells is coupled to a read word line and a write word line, and each column of memory cells is coupled to a read bit line and a write bit line.

In a single port SRAM, the read word line and the write word line for each row of memory cells are the same. Also, the read bit line and write bit line for each column of memory cells are the same in a single port SRAM.

By activating the write word line for a selected row, a data bit can be written into a selected memory cell in the selected row. The data bit is transmitted to the selected memory cell along the write bit line that controls the selected memory cell.

By activating the read word line for a selected row, a data bit can be read from a selected memory cell in the selected row. The data bit is transmitted from the selected memory cell outside the memory array along the read bit line that controls the selected memory cell.

Once a data bit has been read from a memory cell, the data bit can be buffered and amplified using a differential sense amplifier. Differential sense amplifiers are used to reduce the parasitic effects of noise on output signals from a memory array. Noise can cause a bit to be read incorrectly. For example, noise can cause a logic high to be interpreted as a logic low. Differential amplifiers cancel out the effects of noise on output signals from a memory array.

Sometimes the bit line capacitance is very high. When the bit line capacitance is high, the differential voltage is slow to develop across the differential bit lines. A differential amplifier amplifies the differential bit line signal and results in a faster access time for the memory.

Some prior art memory arrays use inverter circuits to sense the bit line voltage. Because voltages on the bit lines change slowly (due to high capacitances), an inverter is slow to sense the bit line voltage.

The output signals of the inverters are multiplexed by a multiplexer. The multiplexer selects a signal from one of the inverter circuits.

Typically, a single multiplexer in a memory array multiplexes signal from numerous read bit lines. For example, a single multiplexer may multiplex signals from 8 bit lines. Prior art multiplexers are slow to read bits from a memory array, because they have to multiplex signals from many read bit lines. Also, long wires may extend from the outputs of the inverters to the inputs of the multiplexer, further slowing down read time.

Therefore, it would be desirable to provide faster techniques for reading data bits from memory cells in a memory array.

BRIEF SUMMARY OF THE INVENTION

The present invention provides high speed techniques for reading data from memory arrays. Memory arrays comprise rows and columns of individual memory cells. Bits are accessed from the memory cells along local read bit lines.

The local read bit lines are coupled to logic gates. The input terminals of each logic gate are coupled to receive signals from two of the local read bit lines. Bits on the local bit lines are passed to the logic gates. In one embodiment of the present invention, the logic gates are NAND gates.

The logic gates are coupled to a global bit line. Pull down transistors cause the voltage on the global bit line to change state when the output signal of one of the logic gates changes state.

Resistive and capacitive (RC) delays on the global bit line become a problem when the length of the wire becomes too long. Memory arrays of the present invention can have multiple global bit lines that are isolated from each other to reduce RC delays. Repeater circuits are coupled in between two global bit lines so that a signal on one global bit line can propagate to another global bit line.

The techniques of the present invention apply to single ended and differential read bit lines. For differential bit lines, the techniques of the present invention can be applied on each one of the differential bit lines.

Other objects, features, and advantages of the present invention will become apparent upon consideration of the following detailed description and the accompanying drawings, in which like reference designations represent like features throughout the figures.

DETAILED DESCRIPTION OF THE INVENTION

The present invention provides high speed techniques for reading data bits from memory arrays. Memory arrays comprise numerous memory cells that are usually arranged in rows and columns. Memory arrays of the present invention can comprise SRAM cells, dynamic random access memory (DRAM) cells, read only memory (ROM) cells, electrically erasable programmable read only memory (EEPROM) cells, EPROM cells, programmable logic arrays (PLAs), FLASH memory, and many other types of memory cells.

Figure 1:
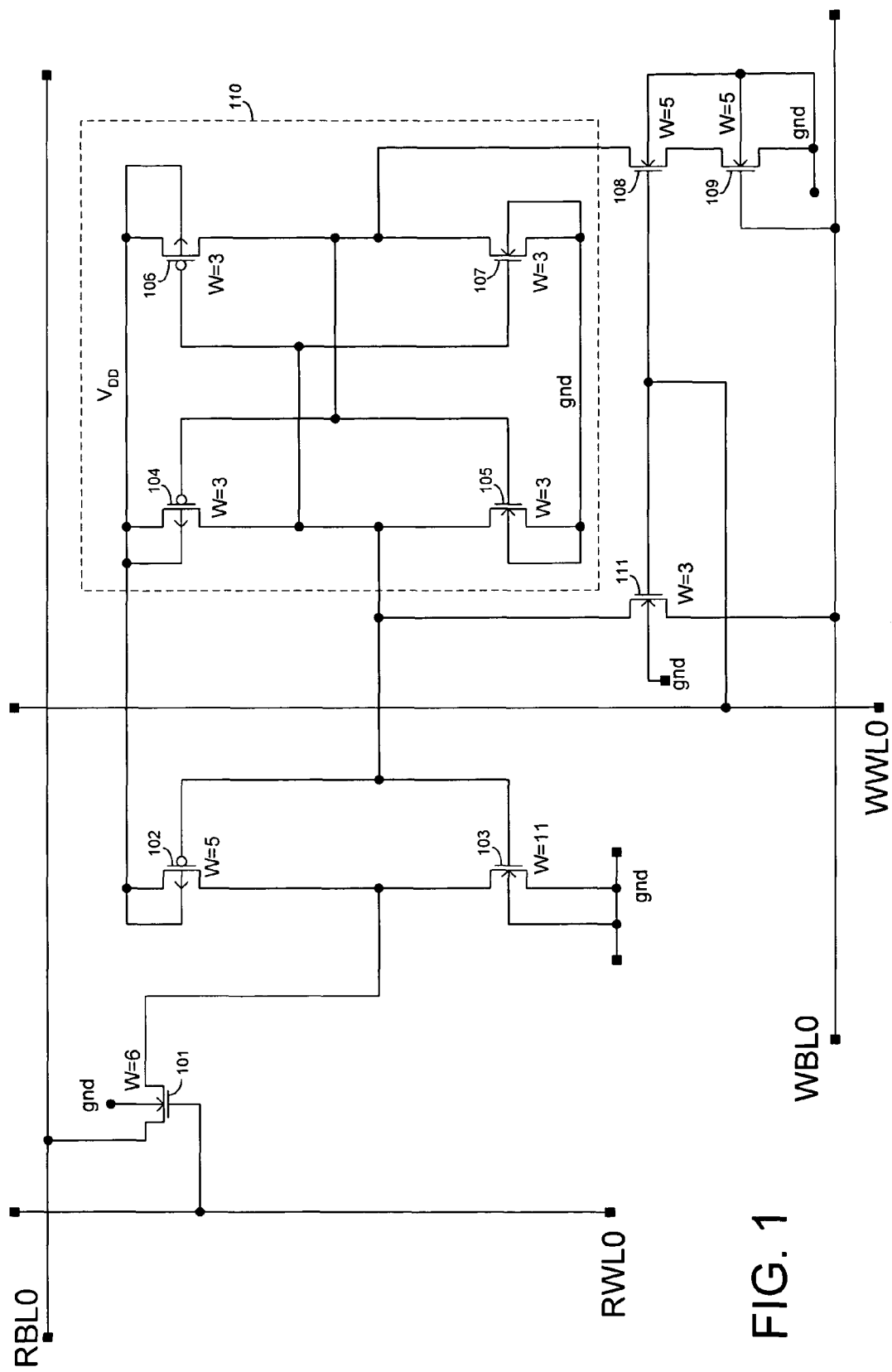
FIG. 1 illustrates a multi-port SRAM cell.

An example of a multi-port SRAM cell that can be used in a memory array of the present invention is illustrated in FIG. 1. The SRAM cell 110 of FIG. 1 includes two cross coupled inverters coupled between supply voltage $V_{DD}$ and ground. The first inverter includes p-channel transistor 104 and n-channel transistor 105. The second inverter includes p-channel transistor 106 and n-channel transistor 107.

SRAM cell 110 is controlled by the write word line WWL0. When the signal on write word line WWL0 goes HIGH, n-channel transistor 111 is turned ON, coupling SRAM cell 110 to write bit line WBL0. A data bit can be written into SRAM cell 110 from write bit line WBL0 through transistor 111.

Write bit line WBL0 can write a HIGH or LOW bit into SRAM cell 110. Transistors 108 and 109 couple a second input of SRAM cell 110 to ground when the signals on write lines WWL0 and WBL0 are HIGH.

When the signal on read word line RWL0 goes HIGH, transistor 101 turns ON. When transistor 101 is ON, read bit line RBL0 is coupled to SRAM cell 110 through the inverter that includes transistors 102 and 103. When the signal on RWL0 goes high, a data bit is read out of SRAM cell 110 along read bit line RBL0. Inverter 102/103 buffers and inverts output signals from SRAM cell 110. RBL0 is always precharged before a READ occurs.

Figure 2:
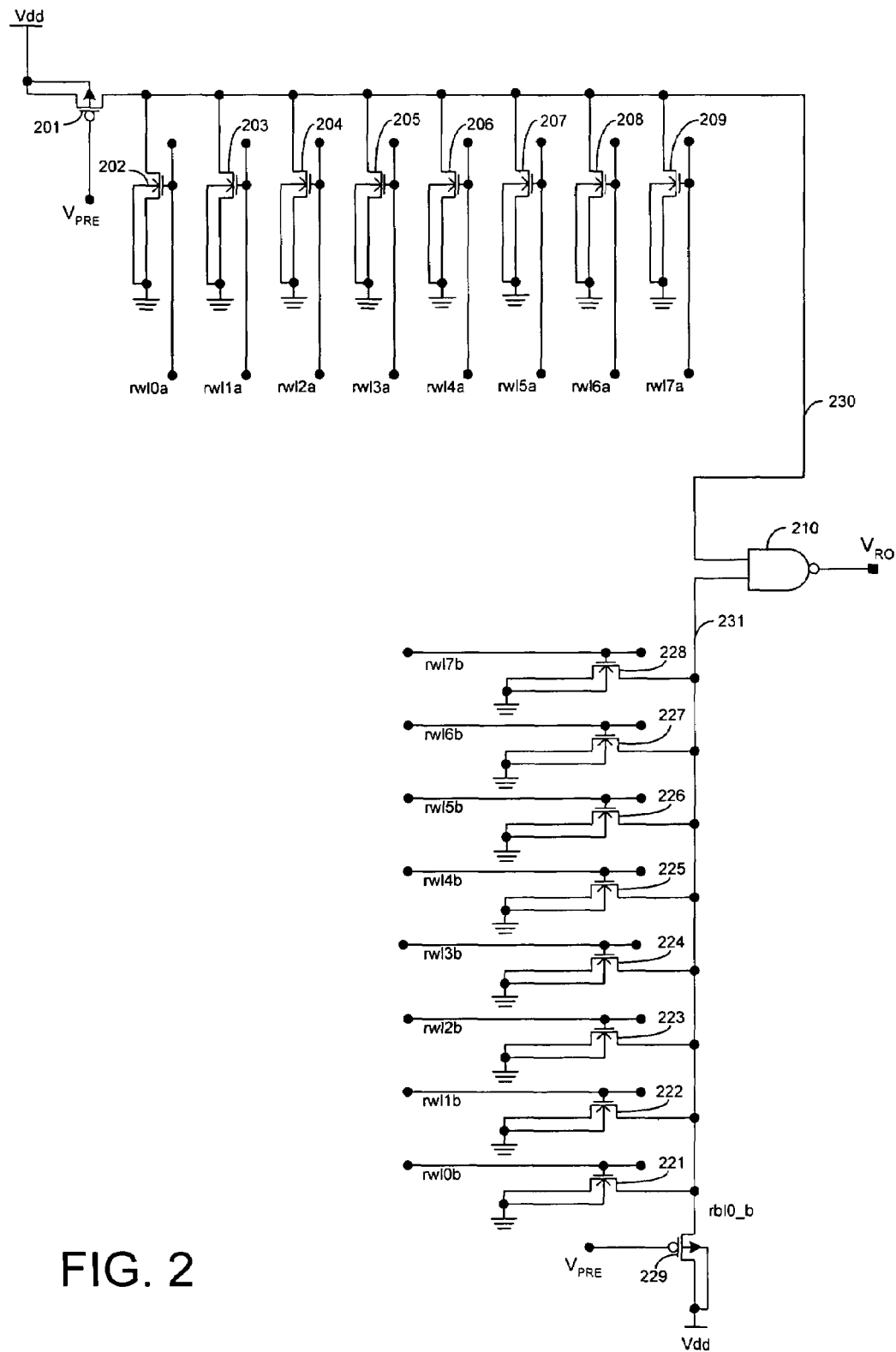
FIG. 2 illustrates two local read bit lines that are coupled to a NAND gate according to an embodiment of the present invention.

A first embodiment of the present invention is illustrated in FIG. 2. Sixteen n-channel MOS field-effect transistors 202-209 and 221-228 are shown in FIG. 2. Transistors 202-209 are coupled to read bit line 230, and transistors and 221-228 are coupled to read bit line 231.

Each one of transistors 202-209 couples read bit line 230 to a corresponding memory cell. Also, each one of transistors 221-228 couples read bit line 231 to a corresponding memory cell. For example, transistor 101 in FIG. 1 is an example of transistors 202-209 and 221-228. The corresponding memory cell may be an SRAM cell as shown, for example, in FIG. 1. The sources of transistors 202-209 and 221-228 are shown as being coupled to ground merely to simply the diagram.

Transistors 202-209 are turned ON and OFF by read word lines rw10a-rw17a, respectively. Transistors 221-228 are turned ON and OFF by read word lines rw10b-rw17b, respectively. Only one read word line (RWL) can be turned on at a time.

Read bit line 230 is pre-charged to supply voltage $V_{DD}$ through p-channel transistor 201. When $V_{PRE}$ goes to GND (i.e., ground), transistor 201 turns ON, and bit line 230 is pre-charged to near $V_DD$. Read line 231 is pre-charged to $V_{DD}$ through p-channel transistor 229. When $V_{PRE}$ goes to GND, transistors 229 turns ON and, and bit line 231 is pre-charged to near $V_{DD}$.

Read bit lines 230 and 231 are both coupled to inputs of NAND gate 210 as shown in FIG. 2. When a signal on one of read word lines rw10a-rw17a or rw10b-rw17b, goes HIGH, a corresponding one of transistors 202-209 or 221-228 turns ON. A bit stored in a memory cell is passed to read bit line 230 or 231 through the transistor 202-209 or 221-228 that is ON.

If a LOW bit is transferred to a read bit line 230 or 231, the read bit line is pulled LOW through one of transistors 202-209 or 221-228. $V_{PRE}$ is HIGH so that transistors 201 and 229 are OFF. When one of the input signals at NAND gate 210 goes LOW, the output signal $V_{RO}$ of NAND gate 210 goes HIGH. Only one of read bit lines 230-231 goes LOW at a time. When a HIGH bit is transferred to read bit line 230 or 231, the output signal $V_{RO}$ of NAND gate 210 remains LOW.

NAND gate 210 replaces the multiplexer of the prior art. NAND gate 210 passes a signal from one of two read bit lines to its output. Signals pass through NAND gate 210 faster than a traditional multiplexer. Prior art multiplexers are typically implemented as an inverter (on a sense bit line) followed by a transmission gate and another inverter (i.e., a multiplexer). The present invention multiplexes the read bit lines with only a one gate delay. Also, in the present invention, NAND gate 210 passes a signal from a read bit line to its output without having to wait for a select signal.

Figure 3:
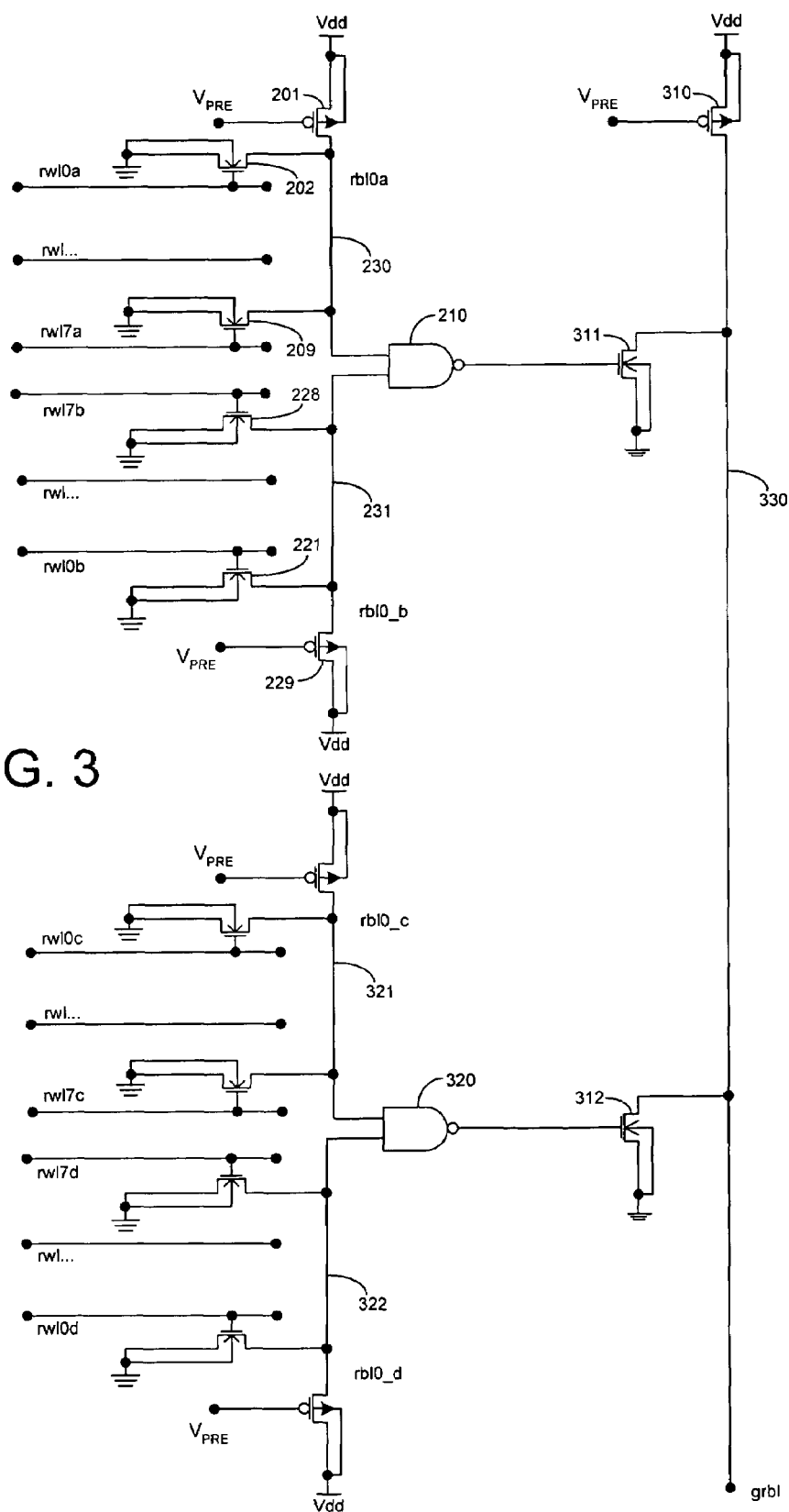
FIG. 3 illustrates two NAND gates and pull down transistors that couple four local read bit lines to a global bit line according to an embodiment of the present invention.

FIG. 3 illustrates a further embodiment of the present invention. Signals on read bit lines are transmitted to NAND gate 210 as discussed above. The output of NAND gate 210 is coupled to n-channel transistor 311. Transistor 311 is coupled between global bit line 330 and ground.

Memory cells are also coupled to other local read bit lines in the memory array. For example, memory cells are coupled to local read bit lines 321 and 322 shown in FIG. 3. Read bit lines 321 and 322 are also pre-charged to near the supply voltage. Read bit lines 321-322 are coupled to NAND gate 320.

When a signal on one of read bit lines 230-231 goes LOW, the output of NAND gate 210 goes LOW, and transistor 311 turns ON. Global bit line 330 is initially pre-charged to near the supply voltage $V_{DD}$ through p-channel transistor 310. When transistor 311 turns ON and transistor 310 is OFF, the voltage on global bit line 330 is pulled LOW.

When a signal on one of read bit lines 321-322 goes LOW, the output of NAND gate 320 goes LOW, and transistor 312 turns ON. When transistor 312 turns ON and transistor 310 is OFF, the voltage on global bit line 330 is pulled LOW.

Bits are transmitted from memory cells in the memory array to global bit line 330 without the use of a traditional multiplexer. Global bit line 330 is isolated from the local read bits lines 230, 231, 321, and 322. Therefore, the small capacitance and resistance on the local read bit lines does not slow down signals transmitted on global bit line 330.

Global bit line 330 is longer than the local bit lines. Therefore, global bit line 330 has a much larger capacitance and resistance than the local bit lines. For example, global bit line 330 can be 1 millimeter long. Global bit line 330 can be as long as the wire RC delays permit timing requirements to be met.

Pull down transistors 311 and 312 have much larger channel widths than transistors 202-209 and 221-228. Because global bit line 330 is a long wire (i.e., with a high capacitance), transistors 311-312 need to draw more current to pull down the voltage on global bit line 330 and to provide a fast discharge. The pull down transistors provide a significant increase in speed over prior art techniques that had a long first level bit line and no second level bit line.

Each of the local bit lines can be coupled to any suitable number of memory cells depending on speed requirements. For example, local bit line 230 can connect to 8, 16, or 32 memory cells. Global bit line 330 can be coupled to any suitable number of pull down transistors. For example, global bit line 330 can be coupled to 2-16 pull down transistors. Only one bit from a memory cell at a time can be transmitted along a global bit line.

According to the present invention, bits from the memory cells are read using one local bit line for each column of memory cells. Prior art techniques used redundant, complimentary read bits lines for each column to drive differential amplifiers. The memory arrays of the present invention use less circuitry and are faster than prior art techniques. The techniques of the present invention can be used with single ended and differential read bit lines. For differential bit lines, the techniques of the present invention can be applied on each one of the differential bit lines.

In a further embodiment of the present invention, two global bit lines can be coupled to inputs of a second level NAND gate. This NAND gate performs the same function as NAND gate 210. Signals pass from the global bit lines through the second level NAND gate much faster than through prior art multiplexers that have many inputs (typically many more than 2).

Figure 4:
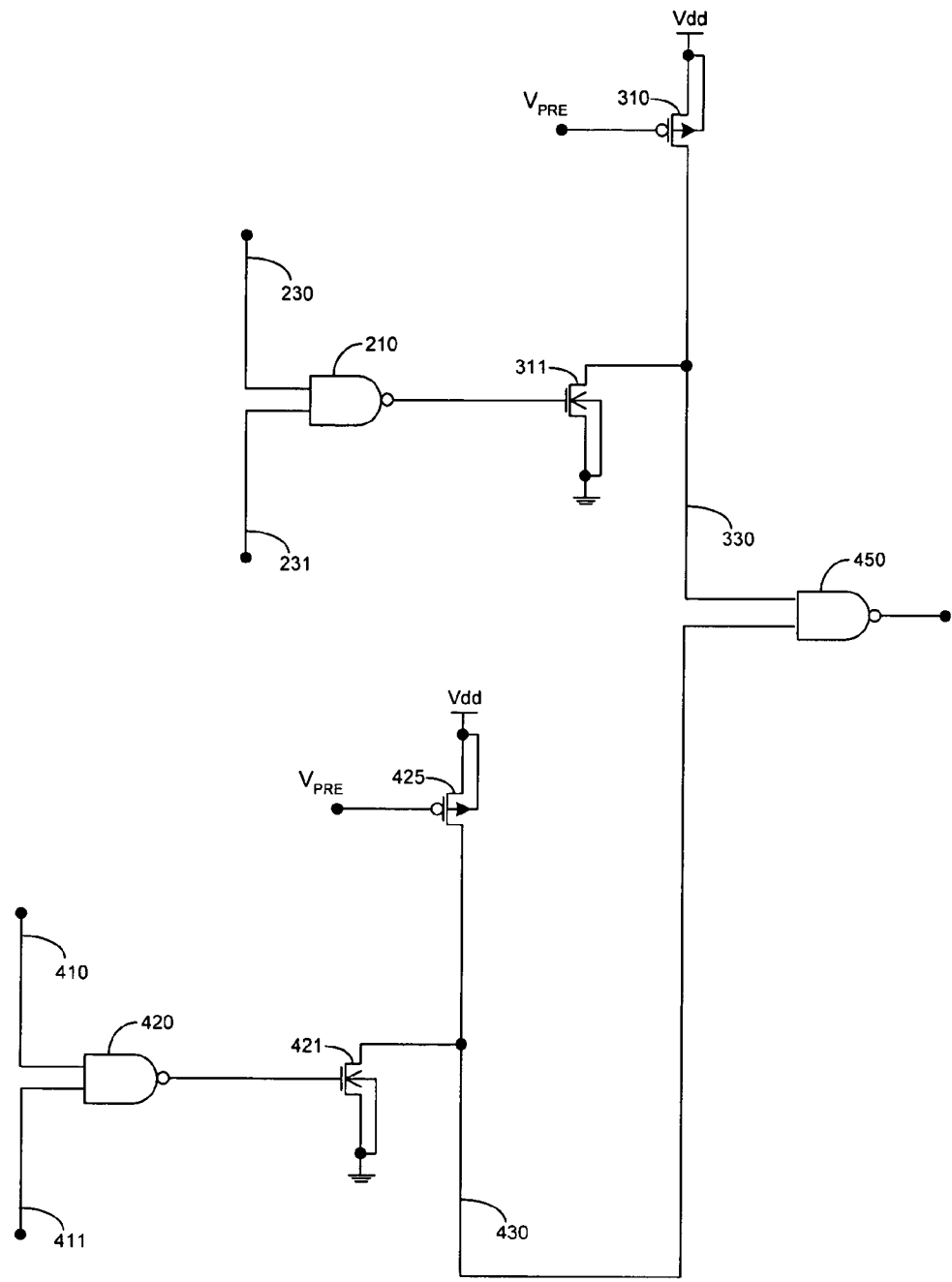
FIG. 4 illustrates a NAND gate that is driven by two global bit lines according to an embodiment of the present invention.

An example of this embodiment is illustrated in FIG. 4. Global bit line 330 is coupled to a first input of NAND gate 450. Global bit line 430 is coupled to a second input of NAND gate 450. NAND gate 450 can drive signals from global bit lines 330 and 430 to a third level read bit line to provide further RC isolation. RC isolation speeds up signals passing on the global and third level bit lines by reducing the resistance and capacitance (RC) on these wires.

NAND gate 450 can also drive signals from the global bit lines to an output pin. Because NAND gate 450 is small device (e.g., four transistors) with only two inputs, it can quickly drive signals from global bit lines 330 and 430 to its output.

Global bit line 430 is pre-charged HIGH by pull up transistor 425 and pulled down LOW by transistor 421. Transistor 421 has a large channel width so that it can provide a fast discharge of line 430.

Bits are transmitted from the memory cells along local read bit lines 410 and 411 to first level NAND gate 420, as discussed above with respect to NAND gate 210. NAND gate 420 drives pull down transistor 421.

Figure 5:
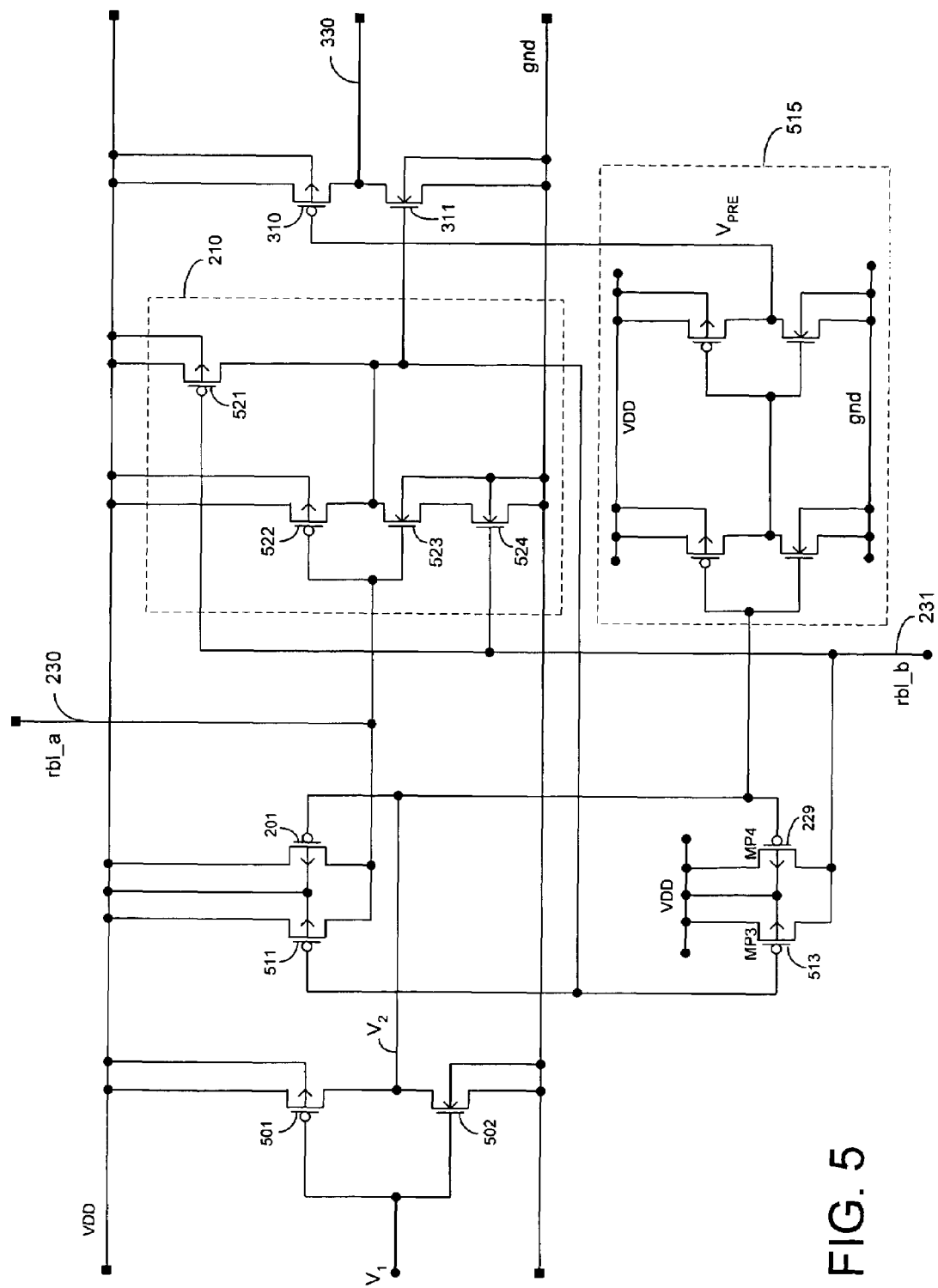
FIG. 5 illustrates a transistor level schematic of circuitry that couples two local bit lines to a global bit line according to an embodiment of the present invention.

FIG. 5 illustrates a transistor level embodiment of pre-charge circuitry and a NAND gate of the present invention. The pre-charge circuitry of FIG. 5 pre-charges the local and global bit lines to a HIGH voltage during a pre-charge cycle. A pre-charge cycle is initiated before a bit is read from a memory cell. A signal indicative of a stored bit can be passed from a memory cell by pulling one of the pre-charged local bits lines and the pre-charged global bit line LOW.

A first pre-charge voltage VI is applied to an input of the pre-charge circuitry as shown in FIG. 5. Voltage VI is increased to a HIGH voltage to initiate a pre-charge cycle. P-channel transistor 501 and n-channel transistor 502 form a CMOS inverter. The output of inverter 501/502 is coupled to the gates of p-channel transistors 201 and 229. When $V_1$ goes HIGH, the output voltage $V_2$ of inverter 501/502 goes LOW, and transistors 201 and 229 turn ON.

Transistors 511 and 201 are coupled in parallel between high supply voltage $V_{DD}$ and local bit line 230. When transistor 201 is ON, the voltage on local bit line 230 is pre-charged to a HIGH voltage. Transistors 513 and 229 are coupled in parallel between high supply voltage $V_{DD}$ and local bit line 231. When transistor 229 is ON, the voltage on local bit line 231 is pre-charged to a HIGH voltage.

The output of inverter 501-502 is also coupled to the input of buffer 515. Buffer 515 includes two CMOS inverters. Buffer 515 delays and buffers the output signal of inverter 501/502. The output signal $V_{PRE}$ of buffer 515 is applied to the gate of p-channel transistor 310. The delay of buffer 515 is preferably set so that transistors 310 and 311 are not ON at the same time.

After voltage $V_1$ goes HIGH, $V_{PRE}$ transitions LOW. Transistor 310 turns ON to pre-charge global bit line 330. The output signal $V_{PRE}$ of buffer 515 is also applied to the gates of other pre-charge transistors in the memory array.

Thus, when $V_1$ goes HIGH to initiate a pre-charge cycle, the local and the global bit lines are pre-charged HIGH. When the pre-charge cycle ends, $V_1$ goes LOW. A bit from a memory cell can now be transmitted along the local and global bit lines as an output signal of the memory array.

Two p-channel transistors 521-522 and two n-channel transistors 523-524 form NAND gate 210 as shown in FIG. 5. Local bit line 230 is coupled to the gates of transistors 522 and 523, and local bit line 231 is coupled to the gates of transistors 521 and 524.

The output of NAND gate 210 is coupled to the gates of p-channel transistors 511 and 513. When the output of NAND gate 210 is LOW, transistor 511 keeps local bit line 230 at a HIGH voltage, and transistor 513 keeps local bit line 231 at a HIGH voltage. Transistors 511 and 513 are called "keepers," because they keep the bit lines HIGH if they are not discharged during a read cycle. The keepers are very small p-channel transistors.

As long as bit lines 230-231 are both HIGH, the output of NAND gate 210 remains LOW, because transistors 523-524 are ON. When the voltage on local bit line 230 or local bit line 231 is pulled LOW, one of transistors 521-522 turns ON, pulling the gate of transistor 311 HIGH. Transistor 311 turns ON, pulling the voltage on global bit line 330 LOW. The LOW signal on the local bit line is transmitted to global bit line 330 in this manner.

Figure 6:
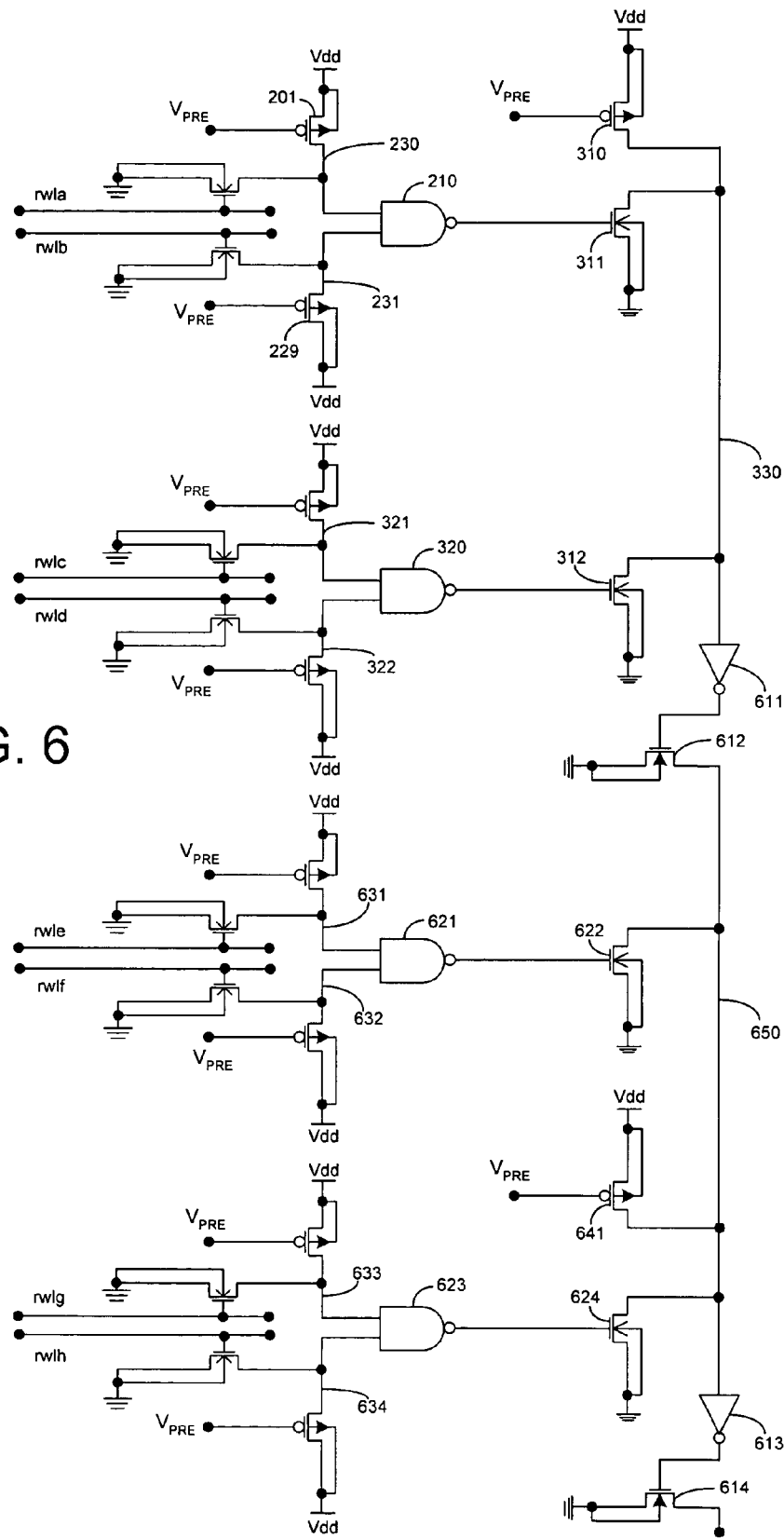
FIG. 6 illustrates a first global bit line that drives a second global bit line through a repeater circuit according to an embodiment of the present invention.

FIG. 6 illustrates an embodiment of repeater circuits that drive signals from one global bit line to another global bit line. Referring to FIG. 6, read bit lines 230 and 231 are coupled to NAND gate 210. Read bit lines 321 and 322 are coupled to NAND gate 320. Read bit lines 631 and 632 are coupled to NAND gate 621. Read bit lines 633 and 634 are coupled to NAND gate 623.

N-channel transistors 311 and 312 pull down pre-charged global bit line 330. N-channel transistors 622 and 624 pull down a second global bit line 650. Global bit line 650 is pre-charged HIGH by p-channel transistor 641.

When transistor 311 or 312 turns ON, the voltage on global bit line 330 is pulled LOW. The LOW signal on bit line 330 can propagate to a second global bit line through repeater circuits 611 and 612. After the voltage on global bit line 330 goes LOW, the output of inverter 611 goes HIGH. Transistor 612 turns ON, pulling the pre-charged voltage on global bit line 650 LOW. Inverters 611 and 613 can be standard CMOS inverters.

The LOW signal on global bit line 650 can propagate to a third bit line through repeater circuits 613 and 614 in the same manner. When the voltage on line 650 goes LOW, the output of inverter 613 goes HIGH. When the output of inverter 613 goes HIGH, transistor 614 turns ON, pulling the pre-charged voltage on a third global bit line LOW.

Signals can propagate from one global bit line to another using the repeater circuitry shown in FIG. 6. The circuitry shown in FIG. 6 is merely one embodiment of the present invention. Other types of repeater circuits can also be used to propagate signals from one bit line to another.

In addition, local read bit lines 631-634 can transmit bits from memory cells to global bit line 650 through circuits 621-624. Signals on segmented global bit line 650 that originate from local bits lines 631-634 can propagate to other segmented global bits lines through repeater circuits 613 and 614.

Rather than providing one global bit line with a large capacitance and resistance, multiple segmented global bit lines are provided in the embodiment of FIG. 6. Capacitance and resistance on a wire tends to slow down signals propagating through the wire.

Segmented global bit lines 330 and 650 are shorter and therefore have less capacitance and resistance than one long global bit line. Repeater circuits 611 and 612 isolate the segmented global bit lines. Signals propagate faster through shorter global bit lines that are isolated by repeater circuits.

Signals originating from a memory cell can propagate to as many segmented global bit lines as needed. FIG. 6 shows four local bits lines for each segmented global bit line. This is merely an example that is not intended to limit the scope of the present invention. Any suitable number of local bits can drive one global bit line.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A memory array circuit comprising:
    memory cells;
    first read bit lines coupled to a first subset of the memory cells;
    first NAND gates coupled to the first read bit lines, wherein each of the first NAND gates has two inputs that are coupled to two of the first read bit lines;
    first transistors, each of the first transistors having an input coupled to an output of one of the first NAND gates;
    a first global bit line coupled to each of the first transistors;
    second read bit lines coupled to a second subset of the memory cells;
    second NAND gates coupled to the second read bit lines, wherein each of the second NAND gates has two inputs that are coupled to two of the second read bit lines;
    second transistors, each of the second transistors having an input coupled to an output of one of the second NAND gates;
    a second global bit line coupled to each of the second transistors; and
    a third NAND gate having a first input coupled to the first global bit line and a second input coupled to the second global bit line.

2. The memory array according to claim 1 further comprising:
    a first pull up transistor coupled to the first global bit line; and
    second pull up transistors, wherein each of the second pull up transistors being coupled to one of the first read bit lines, and wherein the first transistors comprise pull down transistors.

3. The memory array according to claim 1 further comprising:
    a repeater circuit coupled between the first global bit line and the second global bit line.

4. The memory array according to claim 3 wherein:
    the repeater circuit includes an inverter coupled to a third transistor.

5. A memory array circuit comprising:
    memory cells;
    first local read bit lines coupled to a first subset of the memory cells;
    first logic gates, each coupled to receive signals on two of the first local read bit lines;
    a first global bit line;
    first transistors coupled between the first global bit line and the first logic gates;
    second local read bit lines coupled to a second subset of the memory cells;
    second logic gates, each coupled to receive signals on two of the second local read bit lines;
    a second global bit line;
    second transistors coupled between the second global bit line and the second logic gates;
    an inverter circuit coupled to the first global bit line; and
    a third transistor coupled to the inverter circuit and the second global bit line.

6. The memory array according to claim 5 wherein:
    the first logic gates and the second logic gates comprise NAND gates.

7. The memory array according to claim 5 further comprising:
    a NAND gate having a first input coupled to the first global bit line and a second input coupled to the second global bit line.

8. The memory array circuit according to claim 5 further comprising:
    a first pre-charge transistor coupled to the first global bit line; and
    a plurality of second pre-charge transistors that are each coupled to one of the first local read bit lines.

9. A method for reading bits from memory cells in a memory array, the method comprising:
    accessing a first bit from a first memory cell on a first local read bit line;
    transmitting a signal indicative of the first bit from the first local read bit line to a first global bit line through a first logic gate;
    accessing a second bit from a second memory cell on a second local read bit line; and
    transmitting a signal indicative of the second bit from the second local read bit line to the first global bit line through the first logic gate;
    accessing a third bit from a third memory cell on a third local read bit line;
    transmitting a signal indicative of the third bit from the third local read bit line to a second global bit line though a second logic gate;
    accessing a fourth bit from a fourth memory cell on a fourth local read bit line; and
    transmitting a signal indicative of the fourth bit from the fourth local read bit line to the second global bit line through the second logic gate;
    transmitting the signal indicative of the first bit from the first global bit line to the second global bit line through a repeater circuit.

10. The method according to claim 9 wherein:
    the first logic gate comprises a NAND gate.

11. The method according to claim 9 wherein transmitting the signals indicative of the first and the second bits further comprises:
    transmitting the signals indicative of the first and the second bits from the first logic gate to a transistor that is coupled to the first global bit line.

12. The method according to claim 9 wherein the repeater circuit comprises an inverter coupled to the gate of a field effect transistor, and the field effect transistor pulls down the voltage on the second global bit line.

13. The method according to claim 9 wherein:
    the first and the second logic gates comprise NAND gates.

14. The method according to claim 9 further comprising:
    transmitting a signal indicative of the first bit or the second bit from the first global bit line to a third level bit line through a NAND gate; and
    transmitting a signal indicative of the third bit or the fourth bit from the second global bit line to the third level bit line through the NAND gate.

* * * * *